US008878058B2

(12) United States Patent
Wurms et al.

(10) Patent No.: US 8,878,058 B2
(45) Date of Patent: Nov. 4, 2014

(54) RAISED ACCESS FLOOR BOX WITH PARTITIONS

(75) Inventors: Scott B. Wurms, Shelton, CT (US); Matthew J. Lawson, Stamford, CT (US)

(73) Assignee: Hubbell Incorporated, Shelton, CT (US)

( * ) Notice: Subject to any disclaimer, the term of this patent is extended or adjusted under 35 U.S.C. 154(b) by 210 days.

(21) Appl. No.: 13/536,086

(22) Filed: Jun. 28, 2012

(65) Prior Publication Data
US 2014/0000956 A1    Jan. 2, 2014

(51) Int. Cl.
*H02G 3/08* (2006.01)
*H02G 3/18* (2006.01)
*H05K 5/00* (2006.01)

(52) U.S. Cl.
CPC .. *H02G 3/08* (2013.01); *H05K 5/00* (2013.01); *H02G 3/185* (2013.01)
USPC ............... 174/50; 174/53; 174/482; 174/483; 220/3.2; 220/3.3

(58) Field of Classification Search
CPC ......... H02G 3/08; H02G 3/081; H02G 3/086; H02G 3/10; H02G 3/12; H02G 3/121; H02G 3/125; H02G 3/14; H02G 3/185; H02G 3/283; H05K 5/00; H05K 5/02; H05K 5/03; H05K 5/0247
USPC ......... 174/50, 53, 57, 58, 480, 481, 482, 483, 174/484, 486, 488, 489, 490, 495, 559, 66, 174/67; 220/3.2–3.9, 4.02, 241, 242
See application file for complete search history.

(56) References Cited

U.S. PATENT DOCUMENTS

| 3,675,807 | A | | 7/1972 | Lund et al. |
|---|---|---|---|---|
| 5,255,816 | A | | 10/1993 | Trepp |
| 5,362,922 | A | | 11/1994 | Whitehead |
| 5,468,908 | A | * | 11/1995 | Arthur et al. .................. 174/482 |
| 5,486,650 | A | * | 1/1996 | Yetter .............................. 174/53 |
| 5,705,772 | A | | 1/1998 | Brown |
| 5,728,973 | A | | 3/1998 | Jorgensen |
| 5,783,774 | A | * | 7/1998 | Bowman et al. .............. 174/482 |
| 6,274,809 | B1 | * | 8/2001 | Pudims et al. .................. 174/50 |
| 6,342,675 | B1 | * | 1/2002 | DeBartolo et al. ............. 174/50 |
| 6,417,446 | B1 | | 7/2002 | Whitehead |
| 6,455,773 | B2 | | 9/2002 | Bellanger |
| 6,566,600 | B1 | * | 5/2003 | Ford et al. ....................... 174/50 |
| 6,835,890 | B2 | * | 12/2004 | Dinh et al. ...................... 174/66 |
| 7,082,729 | B2 | | 8/2006 | Cole et al. |
| 7,157,643 | B2 | * | 1/2007 | Drane ............................. 174/66 |
| 7,271,351 | B2 | | 9/2007 | Drane |
| 7,825,336 | B2 | * | 11/2010 | Peck ............................... 174/50 |
| 7,989,710 | B2 | | 8/2011 | Hansen et al. |
| 2011/0005799 | A1 | | 1/2011 | Drane |

* cited by examiner

*Primary Examiner* — Angel R Estrada
(74) *Attorney, Agent, or Firm* — Garrett V. Davis; Alfred N. Goodman; Mark S. Bicks

(57) ABSTRACT

An electrical box assembly includes an electrical box and a plurality of partition plates to divide the electrical box into separate compartments to accommodate high voltage wiring device and low voltage wiring devices. The partition plates generally have an angled portion so that compartments can access a knockout in the bottom wall of the electrical box. A plurality of device frames are positioned above the partition plates and coupled to a central support member in the electrical box and a side wall of the electrical box to support an electrical wiring device in the compartments. A cover plate having a configuration corresponding substantially to the shape of the device frame is attached to the device frame and side wall. The cover plate has an opening adapted to receive the wiring device.

35 Claims, 7 Drawing Sheets

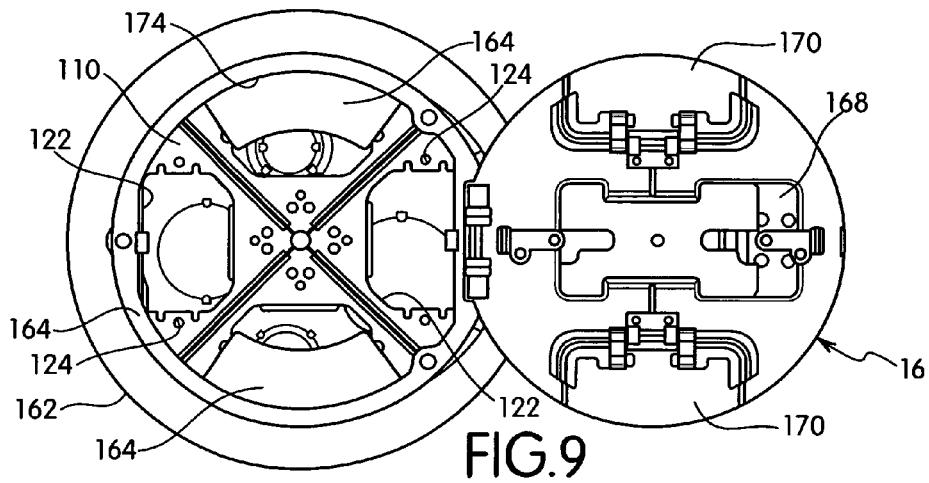
FIG. 9
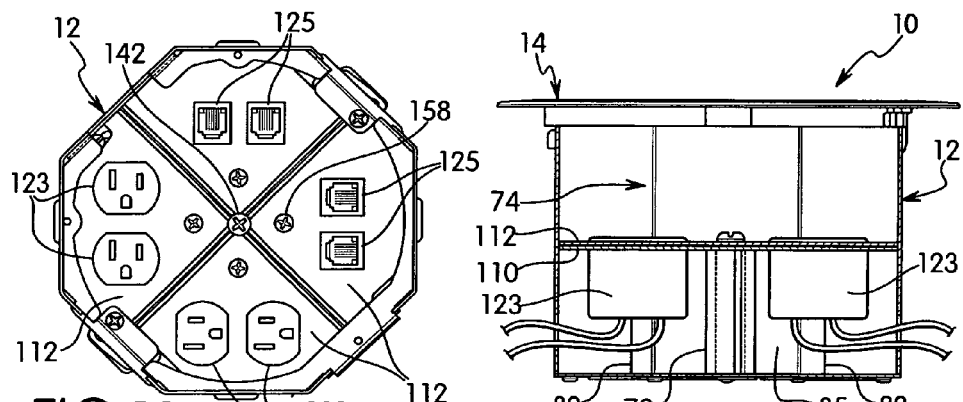
FIG. 10
FIG. 11
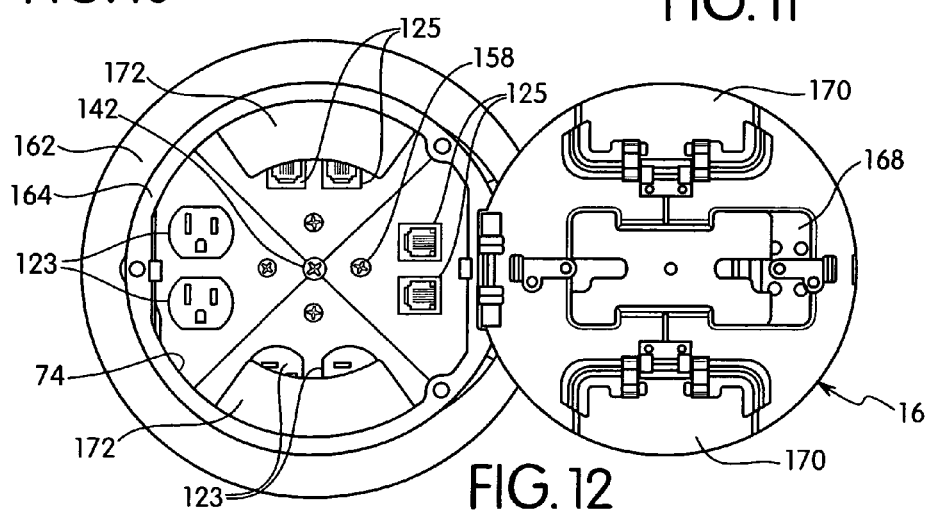
FIG. 12

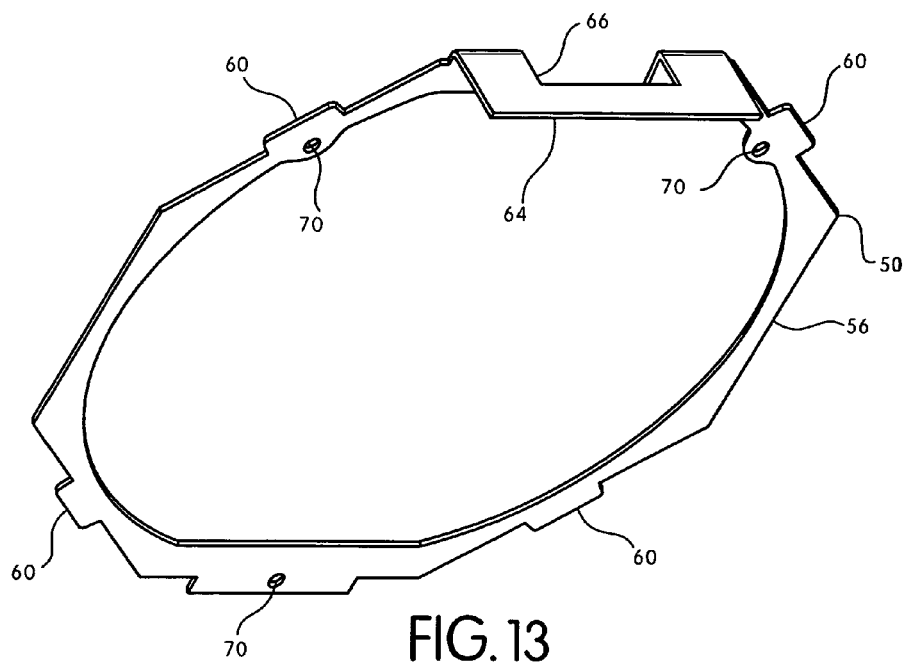
FIG. 13
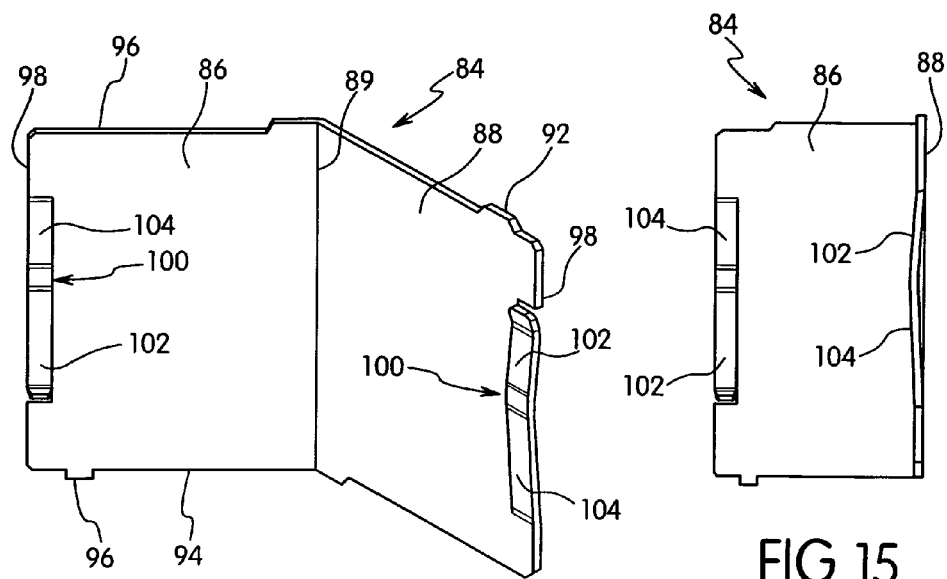
FIG. 14
FIG. 15

RAISED ACCESS FLOOR BOX WITH PARTITIONS

FIELD OF THE INVENTION

The present invention is directed to an electrical box assembly having a plurality of partitions to divide the electrical box into separate compartments. The invention is further directed to an electrical box assembly having a plurality of electrical device supporting frames supported above the partitions and a plurality of cover plates on the device frames.

BACKGROUND OF THE INVENTION

Electrical boxes are commonly used to support electrical wiring devices such as duplex receptacles, switches, telephone and data connectors. Electrical boxes that are intended to support low voltage telephone and/or data connectors require a divider wall or plate to separate the low voltage wiring from the high voltage wiring.

Various examples of electrical boxes are known in the art. For example, U.S. Patent Publication No. 2011/0005799 to Drane discloses a dual voltage electrical floor box having a divider received within a housing. The divider extends across the housing and is received in longitudinal slots on opposite sides of the housing. The electrical devices are mounted in brackets attached to the box.

U.S. Pat. No. 7,989,710 to Hansen et al. discloses a floor box having removable divider plates. The divider plates have one end attached to the side wall of the floor box and a second end received in a divider that extends perpendicular to the dividers.

U.S. Pat. No. 7,271,351 to Drane discloses a modular poke through floor device. The device includes a cylindrical housing and a mounting plate for the electrical wiring devices. A divider plate as shown extends downwardly from the mounting plate to separate the wiring devices.

U.S. Pat. No. 7,082,729 to Cole et al. discloses a cover assembly for an in-floor fitting. The top plate for supporting the electrical device includes a downwardly extending barrier that divides the upper chamber into a central space for power receptacles and radially positioned spaces for communication and data receptacles.

U.S. Pat. No. 6,417,446 to Whitehead discloses a poke through device. The poke through device includes a divider for dividing the poke through into four quadrants. The device is a concealed poke through device having a mounting region defining four equal sized quadrants where at least one of the quadrants includes two electrical outlets and where the lower end communicates with an electrical junction box. A platform supports the electrical device to define the quadrants.

U.S. Pat. No. 6,455,773 to Bellanger discloses a branch connection box for trunking having a base and a cover. The base includes a plurality of partitions that can be cut to form various openings and routing paths.

U.S. Pat. No. 6,274,809 to Pudims et al. discloses a large capacity floor box having a plurality of divider plates extending between the inwardly facing face plates and the outer side wall. The face plates form an inner access area and an outer wire tunnel.

U.S. Pat. No. 5,728,973 to Jorgensen discloses an electrical box having concentric knock-outs. The knock-outs are formed in the bottom wall and the side wall of the electrical box.

While the prior devices are generally suitable for their intended purpose, there is a continuing need in the industry for improved electrical assemblies for housing high voltage and low voltage wiring.

SUMMARY OF THE INVENTION

The present invention is directed to an electrical box assembly, and particularly to an in-floor raised access electrical box. The electrical box assembly of the invention is adapted for mounting in the floor so that the top end of the assembly is substantially flush with the floor surface.

The electrical box assembly of the invention is constructed so that the various internal components of the assembly can pass through the open end of the electrical box and be assembled with the electrical box in place. In one embodiment, the assembly includes internal divider plates, electrical device frames and cover plates that can pass through the open end of the electrical box for mounting in the electrical box after installation.

One aspect of the invention is to provide an electrical box assembly that is simple and easy to assemble in the desired configuration to form a high voltage compartment and a low voltage compartment.

Another aspect of the invention is to provide an electrical box assembly where partitions can be installed in selected locations in the electrical box to form various compartments of different sizes.

A further feature of the invention is to provide an electrical box assembly where one or more partition plates can be mounted in the electrical box after the electrical box is mounted in place. The partition members have a dimension to pass through the opening of the electrical box after installation without disassembling the electrical box or cover.

The electrical box assembly of the invention has a center support member that can be coupled to one or more partitions that extend between the support member and a side wall of the electrical box. The partitions in one embodiment have an angled portion to form an irregularly shaped compartment. The irregularly shaped partition enables positioning of the partition plate to access the knock-outs in the bottom wall of the electrical box.

The electrical box assembly also includes an electrical box with at least one and preferably a plurality of device frames mounted within the electrical box to support one or more electrical wiring devices. The device frames are coupled to a center support member and extend outward to the side wall of the electrical box. The device frames are assembled to form a substantially continuous platform for the wiring devices spaced above the bottom wall of the electrical box and below the top end of the electrical box.

Another feature of the invention is to provide an electrical box assembly having a central support member and a plurality of device frames and cover plate coupled to the support member and the side wall of the electrical box.

These and other aspects of the invention are attained by providing an electrical box assembly comprising an electrical box having a side wall, a bottom wall and an open top end. A cover is coupled to the open top end and has an opening with a dimension to allow access to an electrical wiring device within the electrical box. A partition member is positioned in the electrical box for dividing the electrical box into at least two compartments. A plurality of device frames is coupled to the electrical box at a top end of the divider to cover the at least two compartments. Each of the device frames has an opening for supporting the electrical wiring device in one of the compartments. Each of the device frames has a dimension to be installed through the opening in the cover.

The various aspects of the invention are also attained by providing an electrical floor box comprising an electrical box having a side wall, a bottom wall and an open top end. A support member in a cavity of the electrical box extends upwardly from the bottom wall and has a plurality of coupling members. A plurality of partition members is in the cavity. Each partition member is coupled to a respective coupling member of the support member and extends between the support member and the side wall to define a plurality of compartments separated by the partition members. A plurality of device frames is adapted for supporting an electrical wiring device. Each of the device frames is coupled to the support member and the side wall to support the electrical wiring device in the respective compartments.

The aspects of the invention are further attained by providing an in-floor electrical assembly comprising an electrical box having a side wall, a bottom wall and an open top end. A support member in a cavity of the electrical box extends from the bottom wall. At least two partition members are coupled to the support member and extend between the support member and the side wall to divide the cavity into two compartments. A device frame is coupled to the support member and the side wall to overlie at least one of the compartments. The device frame has an opening adapted to receive an electrical wiring device. A cover plate is coupled to the device frame and has an opening to receive the electrical wiring device.

The various aspects, objects and other salient features of the invention will become apparent from the following detailed description of the invention which, taken in conjunction with the annexed drawings, disclose various embodiments of the invention.

BRIEF DESCRIPTION OF THE DRAWINGS

The following is a brief description of the drawing, in which:

FIG. 9 is a top view of the electrical box assembly showing the device frames and closure member installed;

FIG. 10 is a top view of the electrical box assembly with the hinged cover removed and showing the cover frames receiving the electrical wiring devices;

FIG. 11 is a cross-sectional view of the electrical box showing the device frames and cover frames in position;

FIG. 12 is a top view of the electrical box assembly of FIG. 10 with the hinged cover installed;

FIG. 13 is a perspective view of the top ring of the electrical box;

FIG. 14 is a perspective view of the partition member in one embodiment of the invention;

FIG. 15 is an end view of the partition member;

DETAILED DESCRIPTION OF THE INVENTION

Figure 1:
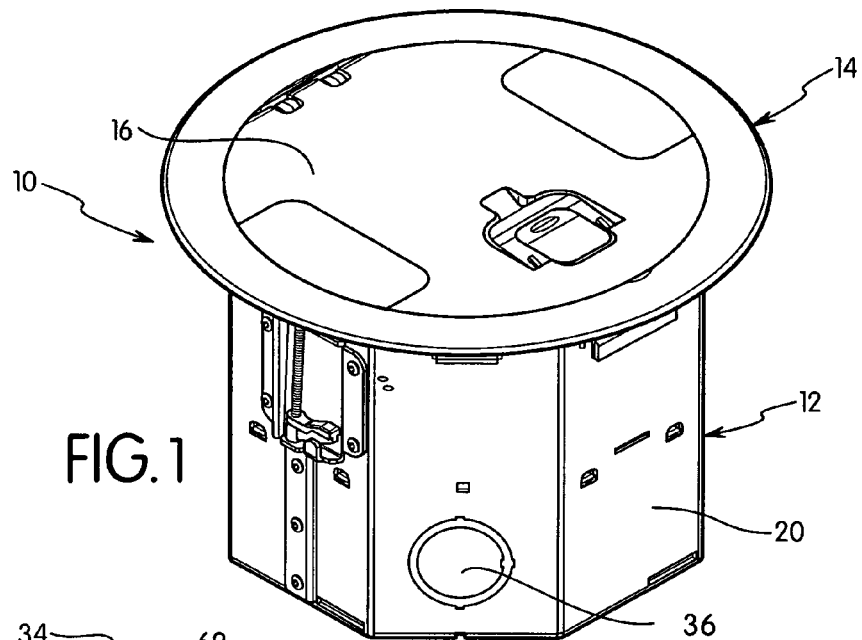
FIG. 1 is a top perspective view of the electrical box assembly in one embodiment of the invention.

The present invention is directed to an electrical box assembly for accommodating a plurality of electrical wiring devices. In particular, the invention is directed to a raised access floor box having a cover for closing the access opening and having an electrical device supporting assembly in the electrical box.

Referring to the drawings, the electrical box assembly 10 includes an electrical box 12 and a cover assembly 14. The cover assembly 14 typically has a hinged cover member 16 for allowing access to the electrical box. Alternatively, the cover assembly 14 can be a temporary cover plate 18 as shown in FIGS. 4 and 5, which can be removed after installation of the electrical box.

Figure 2:
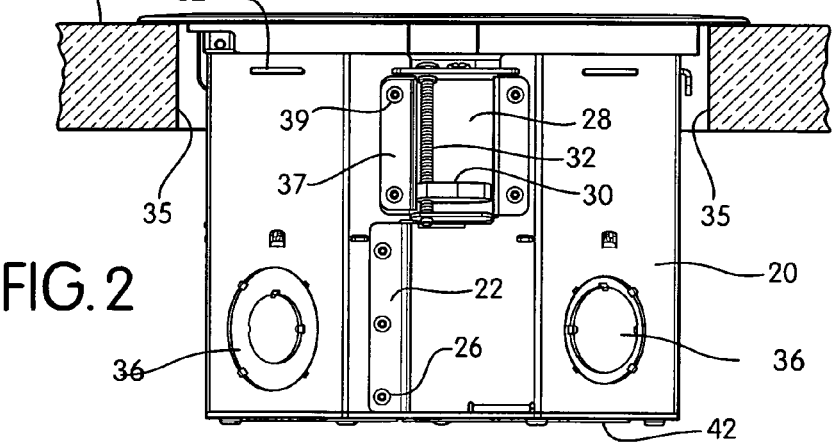
FIG. 2 is a side view of the electrical box assembly of FIG. 1 mounted in a floor.
Figure 3:
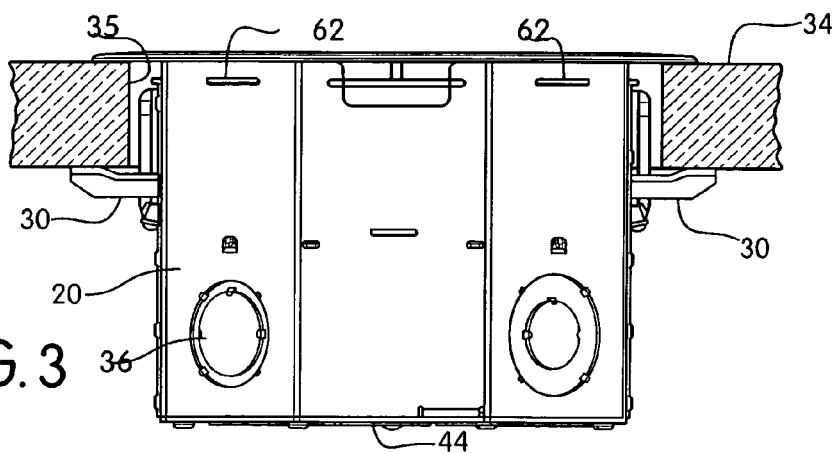
FIG. 3 is a side view of the electrical box assembly showing the coupling arms engaging the floor.

The electrical box 12 in a preferred embodiment of the invention has an octagonal shape to accommodate a round cover assembly 14 as shown in FIGS. 1-3. The electrical box in the embodiment shown is formed from two identical side wall portions 20 that are formed by bending or stamping to produce four wall sections having substantially the same width and length as shown in FIG. 4. Coupling flanges 22 are formed to overlap with the flange 24 of the adjoining wall portion 20 and secured thereto by screws 26 or other fasteners to form the continuous side wall.

Each side wall portion 20 is formed with a recessed portion 28 for receiving a coupling arm 30. The coupling arm 30 is attached to the respective recessed portion 28 by a pivot pin 32 as shown in FIG. 2. The coupling arm 30 pivots from a retracted position shown in FIG. 2 to an extended position shown in FIG. 3 for engaging the lower end of the floor 34 when installed in the opening 35 formed in the floor 34. The side walls of the electrical box 12 can include knock-outs 36 to feed electrical cables into the electrical box 12. In the embodiment shown, the recessed portion 28 is formed by a separate molded sheet metal piece mounted in a cut-out in the side wall 20 and having mounting flanges 37 for coupling to the side wall 20 by rivets 39, screws, or other fasteners.

Figure 4:
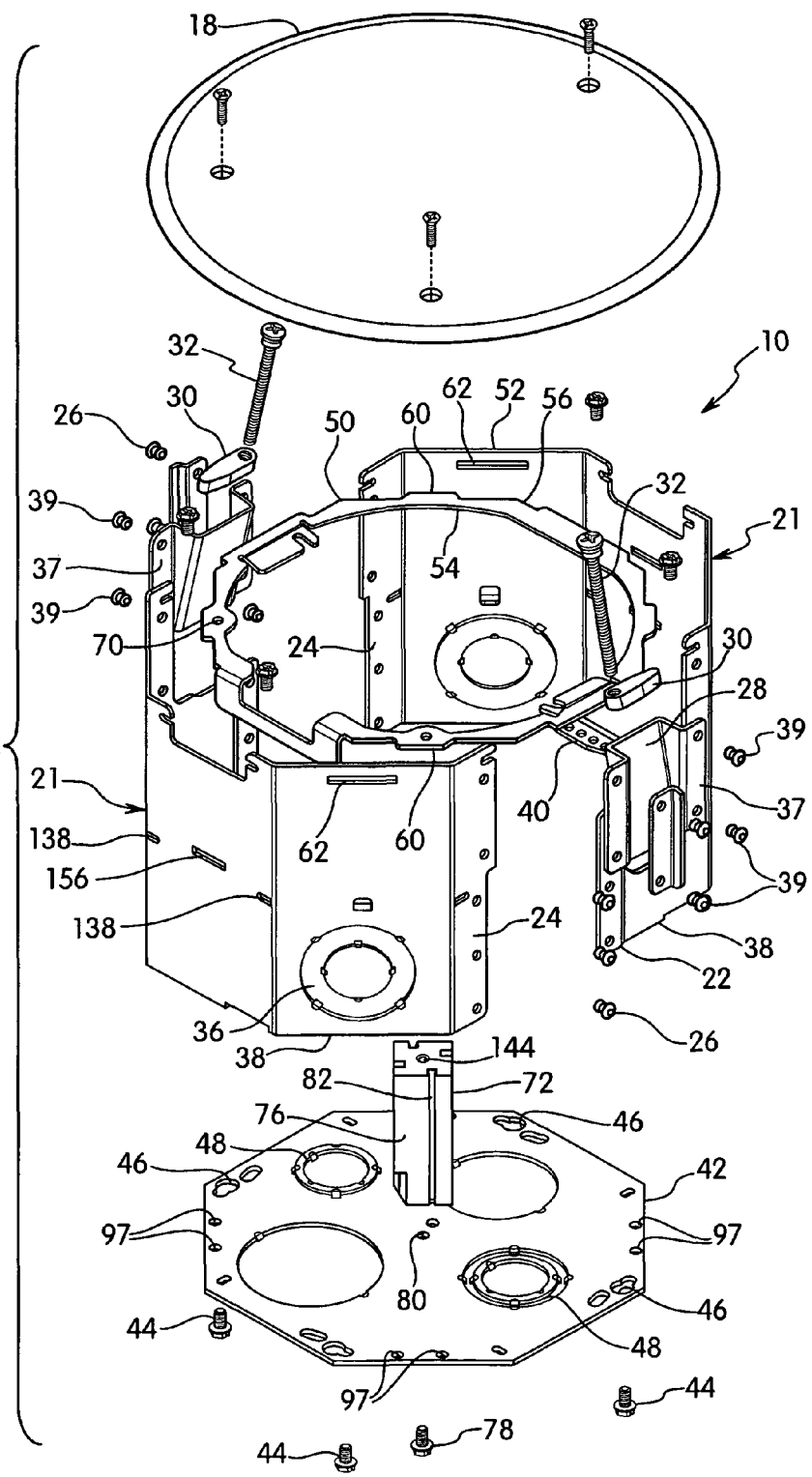
FIG. 4 is an exploded view of the electrical box showing the fixed cover.
Figure 5:
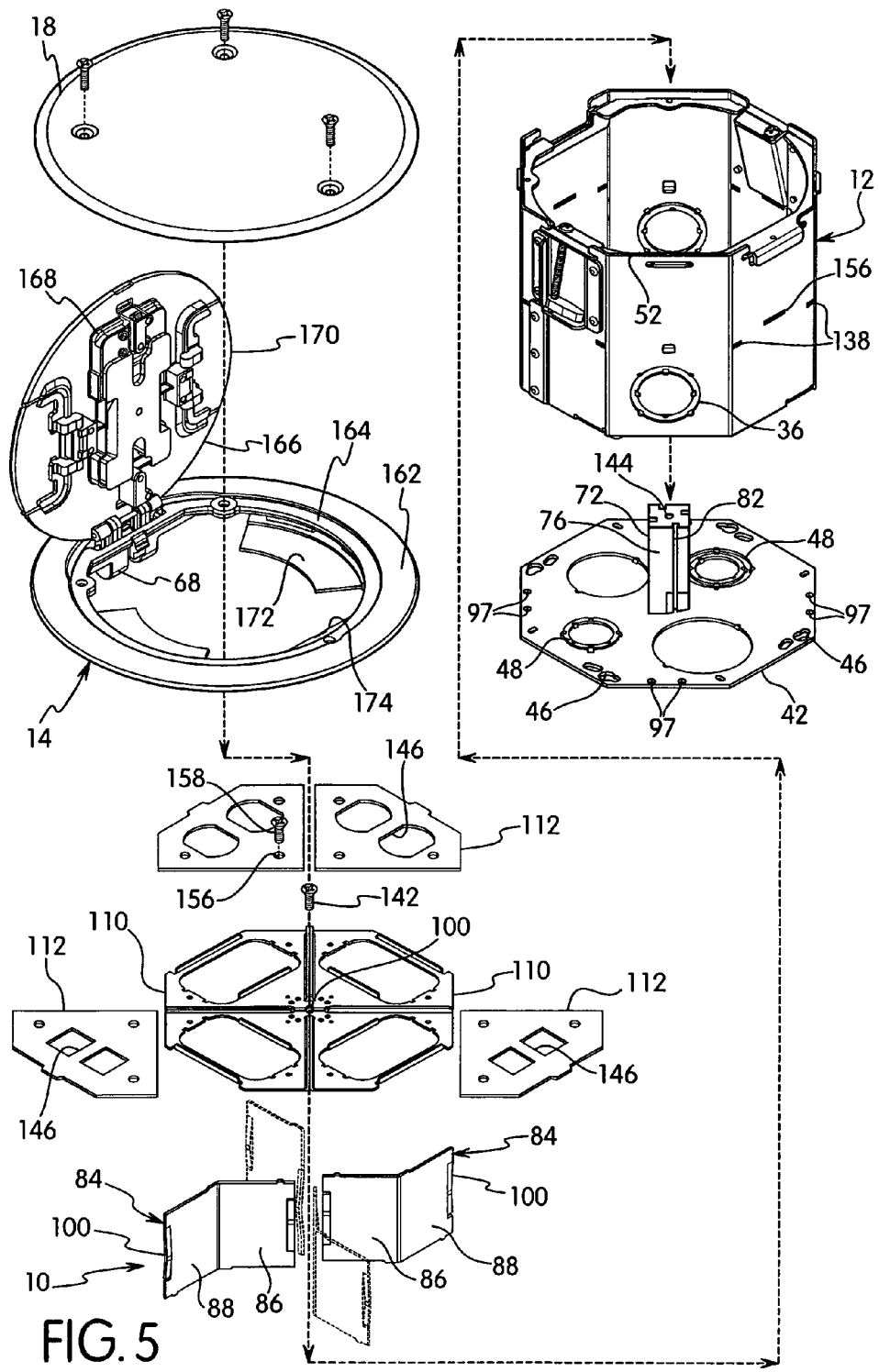
FIG. 5 is an exploded view of the electrical box assembly showing the partitions, device frames and cover frames.
Figure 6:
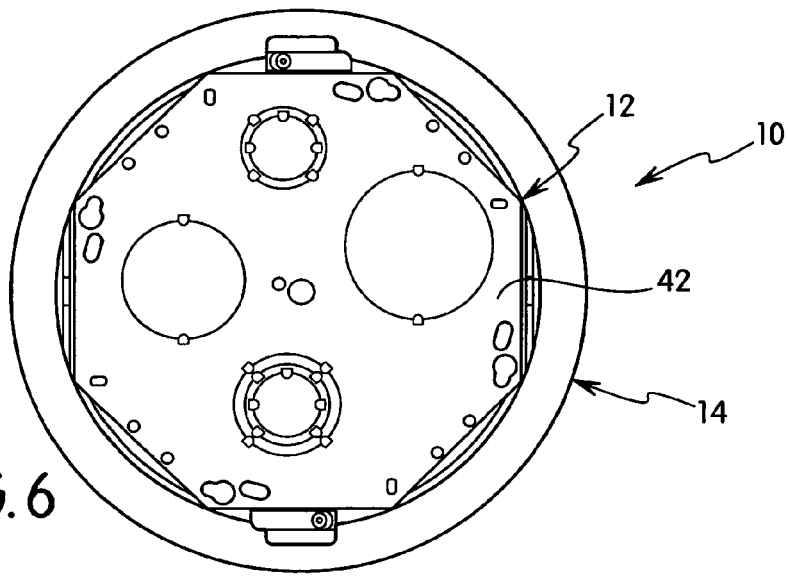
FIG. 6 is a bottom view of the electrical box assembly.

A bottom edge 38 of side wall 20 includes a plurality of coupling tabs 40 extending inwardly as shown in FIG. 4. A bottom wall 42 is coupled to the side wall 20 by screws 44 that pass through corresponding screw holes 46 around the perimeter of the bottom wall 42. The bottom wall 42 also includes a plurality of knock-outs 48 to feed electrical wiring and cables into the electrical box 12.

In the embodiment shown, the bottom wall 42 has an octagonal shape corresponding to the shape and dimension of the side wall 20. A top flange 50 is coupled to the top end 52 of the side wall 20. The top flange 50 is provided for mounting the cover assembly 14 to the electrical box and for supporting the top end of the pivot pins 32. The top flange 50 has a substantially circular inner edge 54 and an octagonal shape outer edge complementing the inner dimension of the side wall 20 as shown in FIGS. 4 and 13. The planar edge portions 58 forming the octagonal shape include an outwardly extending tab 60 that is received within a corresponding aperture 62 in the side wall 20. The tabs 60 are inserted into the respective aperture 62 during the assembly of the two wall portions 20 to secure the top flange 50 to the side wall 20. As shown in FIG. 13, the top flange 50 has a downwardly extending flange 64 with a cutout 66 for accommodating the hinge 68 of the cover assembly 14. Top flange 50 includes a series of screw holes 70 for receiving coupling screws to attach the cover assembly 14 to the electrical box 12.

Figure 7:
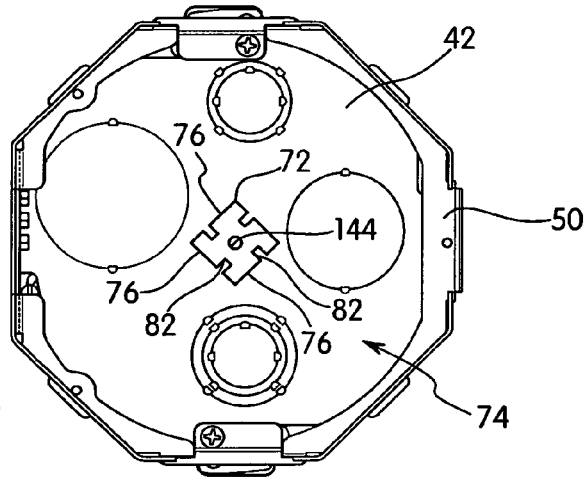
FIG. 7 is a top view of the electrical box with the cover and device frames and closure assembly removed.
Figure 8:
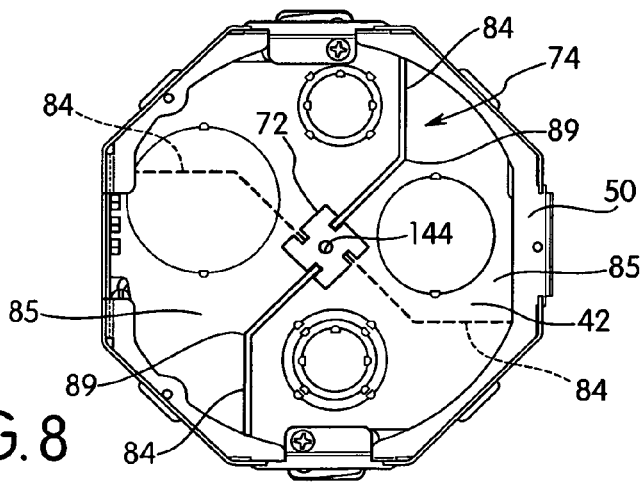
FIG. 8 is a top view of the electrical box with the partition members installed.

A support member 72 is positioned within the cavity 74 of the electrical box 12 as shown in FIGS. 5, 7 and 8. The support member 72 is in the form of a post that is attached to the bottom wall 42 and extends upwardly from and substantially perpendicular to the bottom wall 42. In the embodiment illustrated, the support member 72 has a substantially square cross-section with four planar faces 76. The support member 72 is attached to the bottom wall 42 by a screw 78 that extends through a screw hole 80 in the bottom wall 42 into a screw hole (not shown) in the bottom face of the support member 72. Each of the planar faces 76 of the support member 72 have a longitudinal slot 82 that form a coupling member for a partition member 84. As shown in FIGS. 7 and 8, each of the planar faces 76 of the support member face outwardly toward the side wall 20 of the electrical box. In one embodiment of the invention, each of the planar faces 76 are substantially parallel to one of the wall portions of the side wall 20. In a preferred embodiment, the support member 72 is located in the center of the bottom wall 46 and extends along the axial center of the electrical box 12.

The partition members 84 are provided to divide the cavity 74 of the electrical box into different compartments 85 shown in FIG. 8. The different compartments can be designated for high voltage wiring such as electrical current to a duplex receptacle and for low voltage wiring for telephone or data connections. In the embodiment shown in FIG. 8, two partition members 84 extend from opposite sides of the support member 72. Additional partition members can be inserted as indicated by the phantom lines in FIG. 8 to divide the electrical box into as many as four compartments. Alternatively, the partition members can be removed entirely to form a single compartment.

The partition members 84 extend between the support member 72 and the side wall 20 as shown in FIG. 8. The partition members include first and second sections 86 and 88 formed at an inclined angle with respect to each other along a fold line 89 to form two legs of the partition member. As shown in FIG. 8, the partition member extends from the planar face of the support member 72 to the corner between two adjacent wall portions of the side wall 20. The angled sections of the partition member 84 form an irregularly shaped compartment that can accommodate the wiring and the electrical wiring device. As shown in FIG. 8, the partition members 84 are oriented to expose the knock-outs 48 in the bottom wall 42 so that the partition members do not overlie at least one of the knock-outs and provide adequate space for wire and cable connectors.

Referring to FIGS. 13 and 14, the partition members 84 are substantially symmetrical formed by the first section 86 and the second section 88. A top edge 90 includes a tab 92. The bottom edge 94 has a tab 96 for engaging the bottom wall 42 of the electrical box 12. In one embodiment, the bottom wall 42 has apertures 97 oriented to receive the tab 96 to stabilize the partition member 84 within the electrical box as shown in FIG. 1. Each outer end 98 of the sections 86 and 88 include a coupling member 100 adapted for coupling the partition member 84 to the support member 72. In the embodiment shown, the coupling member 100 is an arm cut from the respective sections 86 and 88 and is bent outwardly in a V-shape to form a first section 102 integrally formed with the section 86 and 88 and a second section 104. The sections 102 and 104 are bent to form a spring biased arm that engages the inner surfaces of the slot 82 in the support member 72. In the embodiment illustrated, the first section 86 and the second section 88 of the partition member 84 are oriented at an angle of about 150°, although the angle can vary depending on the dimensions of the electrical box.

Referring to FIG. 5, the electrical box assembly includes a plurality of electrical device frames 110 for supporting an electrical device and cover frames 112 overlying the electrical devices and the device frames. In the embodiment shown, four device frames 110 are provided that when juxtaposed in the position shown in FIG. 5, have an outer dimension corresponding to the inner dimension of the electrical box. Each device frame 110 has two inner edges 114 for mating with a corresponding inner edge of an adjacent device frame and have a length corresponding to the distance between the center of the support member 72 and the side wall 20 of the electrical box 12. As shown in FIG. 15, the inner edges 114 are substantially perpendicular to each other. The device frames have side edges 116 extending perpendicular from a respective inner edge 114 and an outer edge 118 extending diagonally between the side edges 116. Typically, four device frames 110 are provided to support four wiring devices.

Figure 16:
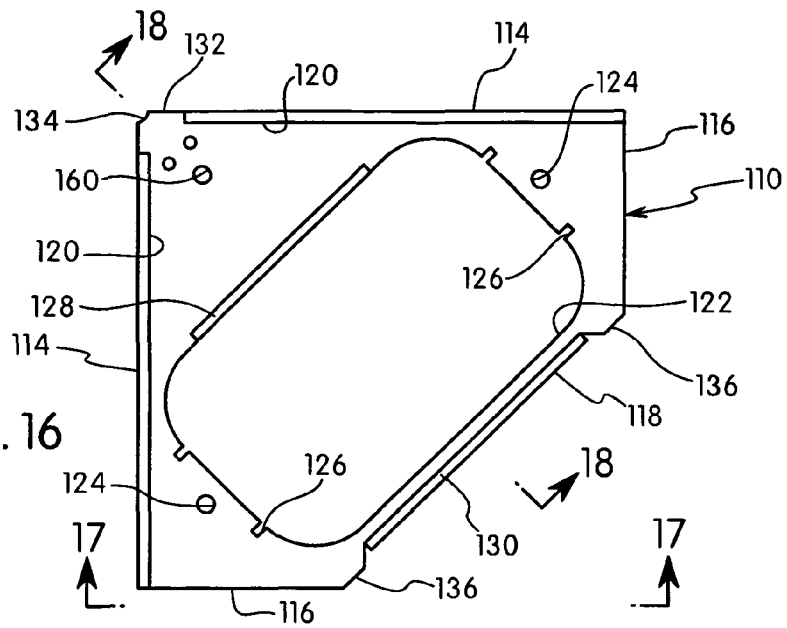
FIG. 16 is a top view of the device frame in one embodiment of the invention.
Figure 17:
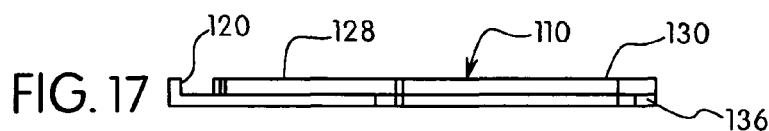
FIG. 17 is an end view of the device frame taken along line 17-17 of FIG. 16.
Figure 18:
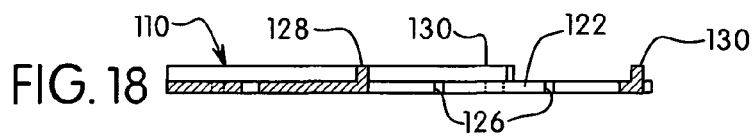
FIG. 18 is a cross-sectional view of the device taken along line 18-18 of FIG. 16.

In one embodiment shown in FIGS. 16-18, the inner edges 114 of the device frame 110 have a strengthening flange 120. The device frame 110 includes a central opening 122 having a dimension for receiving an electrical wiring device such as a duplex receptacle 123, switch or data and telephone jack 125 as shown in FIGS. 10-12. Screw holes 124 and slots 126 are provided adjacent the opening 120 for coupling the electrical wiring device to the device frame 110 by standard mounting screws (not shown). In the embodiment shown, the inner edge of the central opening also includes a strengthening flange 128 extending upwardly from the plane of the device frame 110. The outer edge 118 also includes a flange 130 extending perpendicular from the plane of the device frame to position the electrical device in the opening 122 and strengthen the device frame 110.

As shown in FIG. 15, the flanges 120 along the inner edges extend from the side edge and are spaced outwardly from the corner 132 between the inner edges 114. In the embodiment shown, the corner 132 has a concave recess 134 for cooperating with a mounting screw. The outer edge 118 of the device frame 110 is provided with a pair of tabs 136 that project outwardly in the plane of the device frame.

The device frames are coupled to the electrical box 12 by inserting the tabs 136 into respective apertures 138 formed in the corners of the side wall 20. The device frame is positioned on the top end of the support members 72. As shown in FIG. 5, each of the device frames 110 are positioned to form a platform for supporting the electrical wiring devices. The corners 132 of each of the device frames 110 form a central opening 140 for receiving a coupling screw 142. The screw 142 passes through the central opening 140 into a threaded hole 144 formed in the top end of the support member 72. The head of the screw 142 contacts the top face of the device frames to secure the device frames in place.

Figure 19:
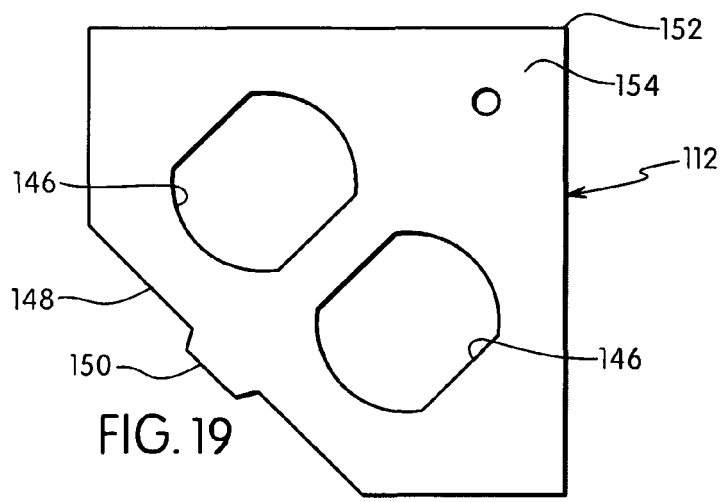
FIG. 19 is a top view of the cover frame.
Figure 20:
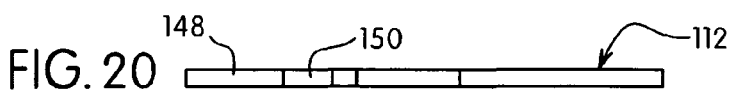
FIG. 20 is an end view of the cover frame of FIG. 19.

The cover frames 112 as shown in FIG. 5 and FIGS. 19 and 20 have a shape corresponding substantially to the shape of the device frame 110. The cover frames 112 have an access opening 146 to receive the electrical wiring device. As shown in FIG. 5, the cover frames 112 can have an opening to correspond to a duplex receptacle 123 or a telephone and data jack 125. The openings can have various shapes and dimensions corresponding to the wiring device being mounted within the electrical box. In the embodiment shown in FIGS. 19 and 20, the openings 146 have a shape corresponding to the face of the duplex receptacle 123. The cover frames are substantially the same except for the shape of the openings 146.

The cover frame 112 has an outer edge 148 with a centrally located tab 150. The inner corner 152 of the cover frame 112 includes a screw hole 154. The tab 150 is received within a corresponding aperture 156 in the side wall 20. A screw 158 extends through the screw hole 156 in the cover frame 112 into a threaded hole 160 in the device frame 110 to secure the cover frame 112 onto the device frame and over the wiring device.

The cover assembly 14 can have various shapes and dimensions depending on the intended use. In the embodiment shown, the cover assembly 14 has an outer frame 162 that is coupled to the top flange 50 by screws or other fasteners. The frame 162 has an inner lip 164 for accommodating the hinged cover 166 and a central opening 174. The hinged cover 166 is connected to the frame 162 by the hinge 68 to fit within the recess defined by the lip 164. The hinged cover 166 in the embodiment shown has a latch 168 for latching the cover in the closed position and movable egress doors 170. The egress doors 170 can pivot inwardly to allow electrical cords to pass through with the cover in the closed position. As shown in FIG. 5, the lip 164 includes a flexible seal 172 extending radially inward at the location of the egress doors to limit dust and material from falling through the opening when the egress doors are in the open position. The electrical box assembly is constructed to enable mounting of various electrical wiring devices and the formation of high voltage and low voltage compartments by selectively positioning the partition members.

As shown in FIG. 8, the partition members 84 can be selectively positioned in the respective slot in the support member 72. Typically, two partition members 84 are mounted within the electrical box on opposite sides of the support member 72 as shown in FIG. 8. In other embodiments, three or four partition members can be mounted within the electrical box to form two, three or four compartments as desired as indicated by the phantom lines in FIG. 8. The device frames 110 and the cover frames 112 are constructed to support the desired wiring device within the selected compartments 85 formed by the partition members 18. Preferably, the support member 72 is positioned below the top edge of the electrical box 12 and the cover assembly 14 so that the device frames 110 and cover frames 112 form a base below the cover assembly 14 a distance so that the electrical plugs or connectors can be connected to the wiring device with the cords extending through the openings formed by the egress doors of the cover assembly.

The electrical box assembly of the invention is generally provided as a kit that can be assembled at the work site. The electrical box 12 with the bottom wall and top flange can be preassembled and provided with several partition members 84, device frames 110 and cover frames 112 that can be assembled as needed at the work site. The partition members 84, device frames 110 and cover frames 112 each have a dimension that can pass through the open top end of the electrical box 12 and the opening of the cover assembly 14 and can be mounted to the electrical box after installation of the electrical box.

The electrical box is generally mounted in a hole formed in the floor as shown in FIGS. 2 and 3. The coupling arm 30 is pivoted outwardly to engage the bottom edge of the floor to secure the electrical box in place. Suitable wiring is passed through the appropriate knockout in the electrical box to supply wiring to the selected compartments. The partition members 84 are passed through the open end 174 of the cover assembly 14 of electrical box 12 and coupled to the support member 72 as shown in FIG. 8. The outer edge of the partition member 84 is preferably positioned in the corner between two adjacent wall portions of the side wall 20 to stabilize the partition member 84. The device frames 110 can then be passed through the open end 174 of the cover assembly 14 of the electrical box and attached to the support member 72 and the side wall 20 of the electrical box as shown in FIG. 9. The electrical wiring devices 123 and 125 are then mounted to the device frame 110 and the cover frames 112 attached to the device frames 110 as shown in FIGS. 10-12.

While various embodiments have been chosen to illustrate the invention, it will be understood by those skilled in the art that various changes and modifications can be made without departing from the scope of the invention as described in the appended claims.

What is claimed is:

1. An electrical box assembly, comprising:
an electrical box having a side wall, a bottom wall and an open top end;
a cover coupled to said open top end and having an opening with a dimension to allow access to an electrical wiring device within the electrical box;
a partition member positioned in the electrical box for dividing the electrical box into at least two compartments having an open top end facing said open top end of said electrical box; and
a plurality of device frames coupled to said electrical box at a top edge of said partition member to cover said open top end of said at least two compartments, each of said device frames having an opening for supporting the electrical wiring device in one of said compartments, each of said device frames having a dimension to be installed through said opening in said cover.

2. The assembly of claim 1, wherein
said cover has a frame coupled to the top end of the electrical box, and
a closure member hinged to said frame, said device frames being positioned below said cover frame and closure member to define a cavity to receive an electrical plug when said closure member is in a closed position.

3. The assembly of claim 1, further comprising
a support member in said electrical box and extending upwardly from said bottom wall, said partition member being coupled to said support member and extending between said support member and said side wall of said electrical box; and
where said device frames are coupled to said support member and said side wall of said electrical box.

4. The assembly of claim 3, wherein
said partition member includes a first planar portion with a coupling member for coupling to said support member and a second planar portion extending at an incline with respect to a plane of said first planar portion.

5. The assembly of claim 3, wherein
said support member is centrally located in said electrical box, and includes a plurality of longitudinal slots for receiving an end of a respective partition member, and a top end for supporting each of said device frames.

6. The assembly of claim 5, wherein
said partition members having a coupling member at one end for mating with a respective slot of said support member.

7. The assembly of claim 6, wherein
said coupling member of said partition member is a spring biased arm for frictionally engaging a respective slot in said support member.

8. The assembly of claim 3, wherein
each of said device frames have an inner edge coupled to said support member and an outer edge having coupling tabs received in a respective opening in said side wall.

9. The assembly of claim 3, further comprising
a cover frame overlying a respective device frame and coupled to said device frame, said cover frame having an opening with a dimension to receive said electrical device.

10. The assembly of claim 9, wherein
said cover frame has an inner edge coupled to said device frame and an outer edge with a coupling tab received in a respective opening in said side wall of said electrical box.

11. The assembly of claim 1, wherein
said device frames have an outer edge coupled to said side wall of said electrical box.

12. The assembly of claim 11, wherein
said outer edge of said device frames have a tab and said side wall of said electrical box has a slot receiving said tab for coupling said device frames to said side wall.

13. The assembly of claim 1, wherein
said device frames are spaced from said bottom wall and spaced from said open top end of said electrical box and where said openings in said device frames face said open top end of said electrical box.

14. The assembly of claim 13, wherein
said device frames are juxtaposed to each other to form a platform spaced from said bottom wall of said electrical box for supporting the electrical wiring devices.

15. The assembly of claim 1, wherein
said device frames extend inwardly from said side wall of said electrical box and are juxtaposed to form a platform for supporting said electrical wiring devices, and where said platform is spaced from said bottom wall and spaced from said open top end of said electrical box.

16. The assembly of claim 1, wherein
said partition member has a bottom edge contacting said bottom wall of said electrical box, an outer edge contacting said side wall of said electrical box and a top edge opposite said bottom edge, and where said device frame overlies said top edge of said partition member.

17. An electrical floor box comprising:
an electrical box having a side wall, a bottom wall and an open top end;
a support member in a cavity of said electrical box and extending upwardly from said bottom wall, said support member having a plurality of coupling members;
a plurality of partition members in said cavity, each of said partition members coupled to a respective coupling member of said support member and extending between said support member and said side wall to define a plurality of compartments separated by said partition members; and
a plurality of device frames adapted for supporting an electrical wiring device, each of said device frames being coupled to said support member and said side wall to support the electrical wiring device in the respective compartments.

18. The electrical floor box of claim 17, wherein
said support member has a longitudinal slot defining said coupling member, and wherein a first end of a respective partition member is received in said slot.

19. The electrical floor box of claim 18, wherein
said partition member has a first end with a spring biased tab received in said slot for coupling to said support member.

20. The electrical floor box of claim 17, wherein
each of said device frames are juxtaposed to each other to overlie said compartments.

21. The electrical floor box of claim 17, wherein
each of said device frames have a first end coupled to said support member and a second end with a coupling tab received in a respective opening in said side wall of said electrical box.

22. The electrical floor box of claim 21, wherein
said support member is centrally located within said electrical box.

23. The electrical floor box of claim 17, further comprising
a plurality of cover frames overlying a respective device frame, each of said cover frames having an opening to receive the electrical wiring device of said device frame.

24. The electrical floor box of claim 23, wherein
each of said cover frames has a first end coupled to said respective device frame and a second end coupled to said side wall of said electrical box.

25. The electrical floor box of claim 24, wherein
said second end of said cover frame has a coupling tab received in a respective opening in said side wall of said electrical box.

26. The electrical floor box of claim 17, wherein
each of said partition members has a first planar portion adapted for coupling to said support member, and a second planar portion adapted for coupling to said side wall of said electrical box, said second planar portion extending at an incline with respect to said first portion.

27. An in-floor electrical assembly comprising:
an electrical box having a side wall, a bottom wall and an open top end;
a support member in a cavity of said electrical box and extending from said bottom wall;
at least two partition members coupled to said support member and extending between said support member and said side wall to divide the cavity into two compartments;
a device frame coupled to said support member and said side wall to overlie at least one of said compartments, said device frame having an opening adapted to receive an electrical wiring device; and
a cover plate coupled to said device frame and having an opening to receive the electrical wiring device.

28. The assembly of claim 27, further comprising
a cover assembly coupled to said open top end of said electrical box, said cover assembly having an access opening and a movable closure member to close said access opening, and where said device frames have a dimension to pass through said access opening for installation in said electrical box.

29. The assembly of claim 27, wherein
said support member is centrally located in said electrical box and includes a plurality of longitudinally extending slots for receiving an end of a respective partition member.

30. The assembly of claim 29, wherein
each of said partition members have a first edge with a spring biased tab adapted for mating with a respective slot in said support member, and a second end adapted for mating with said side wall of said electrical box.

31. The assembly of claim 30, wherein
each of said partition members have a bottom edge and a projecting tab, and where said bottom wall has an aperture adapted to receive said tab.

32. The assembly of claim 31, wherein
each of said partition members has a first planar portion, and a second planar portion oriented at an incline with respect to a plane of said first planar portion.

33. The assembly of claim 27, wherein
said device frame has a first end coupled to said support member and a second end having a tab received in a corresponding aperture in said side wall of said electrical box.

34. The assembly of claim 33, wherein
said cover plate has a first end coupled to said device frame and a second end having a tab received in a corresponding aperture in said side wall of said electrical box.

35. The assembly of claim 27, further comprising
a plurality of said device frames, each of said device frames being coupled to said support member and said side wall of said electrical box, said device frames being oriented to divide said electrical box into a bottom section and top section and positioned below said open top end of said electrical box a distance to allow a plug to be connected to the electrical wiring device and be received in said top section.

* * * * *